United States Patent
Fumagalli et al.

(10) Patent No.: US 6,949,778 B2
(45) Date of Patent: Sep. 27, 2005

(54) ARRAY OF SEMICONDUCTING LAYERS FOR SPIN INJECTION WITH HIGH EFFICIENCY

(75) Inventors: Paul Fumagalli, Berlin (DE); Holger Lippitz, Berlin (DE); Christian Müller, Berlin (DE); Jens J. Paggel, Berlin (DE)

(73) Assignee: Freie Universitaet Berlin, Berlin (DE)

(*) Notice: Subject to any disclaimer, the term of this patent is extended or adjusted under 35 U.S.C. 154(b) by 0 days.

(21) Appl. No.: 10/637,704

(22) Filed: Aug. 11, 2003

(65) Prior Publication Data

US 2004/0104415 A1 Jun. 3, 2004

(30) Foreign Application Priority Data

Aug. 9, 2002 (EP) ............................................ 02090288
Aug. 27, 2002 (EP) ............................................ 02090303

(51) Int. Cl.$^7$ ............................................... H01L 29/76
(52) U.S. Cl. ....................................... 257/295; 257/421
(58) Field of Search ................................ 257/295, 421, 257/425

(56) References Cited

U.S. PATENT DOCUMENTS 6,753,562 B1 * 6/2004 Hsu et al. .................... 257/295
2001/0031547 A1 10/2001 Ohno et al

FOREIGN PATENT DOCUMENTS

EP  0 622 791 A1  11/1994

OTHER PUBLICATIONS

S. Datta et al., "Electronic analog of the ectro-optic modulator", Appl. Phys. Lett. vol. 56, No. 7, Feb. 12, 1990, pp. 665–667.

T. Dietl, "Ferromagnetic semiconductors," Semiconductor Science and Technology, vol. 17 2002, pp. 377–392.*
P. Fumagalli et al., "Exchange–induced enhancement of $T_c$ in $Co_{1-x}(EuS)_x$ macroscopic ferrimagnets", Physical Review B, vol. 57, No. 22, Jun. 1, 1998, pp. 294–298.
R. Gambino et al., "Magneto–Optic Properties of Macroscopic Ferrimagnets, IEEE Transactions on Magnetics", vol. 30, No. 6, Nov. 1994, pp. 4461–4463.
X. Hao, et al., "Spin–filter effect of ferromagnetic europium sulfide tunnel barriers", Physical Review B., vol. 42, No.13, Nov. 1, 1990, pp. 8235–8243.
K. Kawaguchi, et al., "$^{151}$Eu and $^{57}$Fe Mössbauer and magnetization study on $EuO_x$/Fe multilayered films", Journal of Magnetism and Magnetic Materials, vol. 171–181, 1998, pp. 1186–1188*.
K. Kawaguchi, et al., "Magnetic properties of Fe/EuO multilayered films", Journal of Magnetism and Magnetic Materials, vol. 156, 1996, pp. 235–236*.
E. Kisker, et al., "Electron field emission from ferromagnetic europium sulfide on tungsten", Physical Review B, vol. 18, No. 5, Sep. 1, 1978, pp. 2256–2275.
U. Rücker, "Magnetic coupling phenomena in epitaxial layered systems consisting of iron and the ferromagnetic semiconductor europium sulphide", May, 1998, pp. 1–2, 43–46, 67–70*.

(Continued)

*Primary Examiner*—Minh-Loan Tran
(74) *Attorney, Agent, or Firm*—Rothwell, Figg, Ernst & Manback, P.C.

(57) ABSTRACT

This invention relates to a semiconductor array having a first semiconducting layer and a second semiconducting layer made of a ferromagnetic material, which is coupled to the first semiconducting layer in such a way that a spin-polarized state of the semiconducting charge carriers is injected into the first semiconducting layer. The second semiconducting layer interacts with charge carriers made available outside of the second semiconducting layer in such a way that a high spin polarization is created in the second semiconducting layer at least 250 Kelvin.

27 Claims, 5 Drawing Sheets

OTHER PUBLICATIONS

G. Schmidt, et al., "Fundamental obstacle for electrical spin injection from a ferromagnetic metal into a diffusive semiconductor", Physical Review B, vol. 62, No. 8, Aug. 15, 2000, pp. 4790–4793.

S.A. Wolf, et al., "Spintronics: A Spin–Based Electronics Vision for the Future", Science, vol. 294, Nov. 16, 2001, pp. 1488–1495*.

* cited by examiner 5A 5B 5C 5D

ARRAY OF SEMICONDUCTING LAYERS FOR SPIN INJECTION WITH HIGH EFFICIENCY

This application claims priority from European Patent Office Application No. EP 02090288.8, filed Aug. 9, 2002 and European Patent Office Application No. EP 02090303.5, filed Aug. 27, 2002. This application incorporates by reference the entire contents of European Patent Office Application Nos. EP 02090288.8 and EP 02090303.5.

BACKGROUND AND INTRODUCTION

This invention relates to a semiconductor array having a semiconductor layer and a layer of a ferromagnetic material coupled to it, wherein the layer of ferromagnic material injects a spin-polarized state of semiconducting charge carriers into the semiconductor layer.

The goal of creating such an arrangement is to produce in a semiconducting material, e.g., GaAs or Si, which can be used to produce semiconductor components a spin state having the highest possible polarization, so that not only the charge carriers as such but also the spin of the charge carriers in the semiconductor component serve as an information medium. In this way, it is possible to achieve much shorter switching times, and, as a result, to produce faster semiconducting components (e.g., so-called spin transistors).

One problem with the spin electronics (spintronics) described above is to achieve a sufficiently high spin polarization in a conventional semiconducting material such as GaAs or Si.

It has been proposed to apply a ferromagnetic metal to a semiconducting layer. A current flowing through such a ferromagnetic material is always spin polarized, since the magnetism in metallic ferromagnetic materials is produced by spin polarization of the charge carriers. However, in the past, these spin-polarized charge carriers could not be transmitted into the adjacent semiconductor to a sufficient extent. This is because, as a result of the difference in the resistance of metal, on the one hand, and semiconductors on the other hand, injection of spin polarization from a metal into a semiconductor is very inefficient. This can be attributed to the fact that the total electric resistance of a metal-semiconductor component is determined by the resistance of the semiconductor, which in turn is independent of the direction of spin.

The invention aims at creating a semiconductor array of the above type having optimized spin polarization of the semiconductor charge carriers in the semiconducting layer.

This problem is solved in accordance with the present invention by creating a semiconductor array having the features of claim 1.

Accordingly, a first semiconductor layer (preferably formed from GaAs or Si) is coupled to a second semiconducting layer of a ferromagnetic material (e.g., EuS), so that a spin-polarized state of the semiconducting charge carriers is injected into the first semiconducting layer, and the second semiconducting layer interacts with charge carriers outside of the second semiconducting layer (which are, e.g., made available through an additional metal layer), to create a highly spinpolarized state of the second semiconducting layer at a temperature of at least 250 Kelvin, preferably at at least 270 Kelvin and especially preferably at at least 300 Kelvin.

The present invention is based on the surprising finding that, at temperatures above room temperature, a high spin polarization can exist in a ferromagnetic semiconductor such as EuS if said ferromagnetic semiconductor interacts with additional (free) charge carriers.

Such a spin polarized semiconductor, in which the spin-polarized (magnetic) state exists at temperatures of 250 Kelvin and above, is in turn suitable for injecting spin polarization into a first semiconducting layer, which is formed by a traditional semiconductor (not magnetic) which is especially suitable for rapid switching operations, e.g., GaAs, Si or by some other elemental semiconductor and/or conventional III-V or II-VI semiconductors. This is because the semiconducting properties of the ferromagnetic material (second semiconducting layer) ensure that the electric resistance of said second semiconducting layer is comparable to the electric resistance of the first semiconducting layer (made of GaAs and/or Si) so that the high spin polarization of the second semiconducting layer can be transmitted into the first semiconducting layer.

However, the fact that the known ferromagnetic semiconductors have Curie temperatures far below 250 Kelvin is in conflict with the solution according to this invention. Among the Eu chalcogenides, for example, the material EuO has the highest Curie temperature of approximately 110 Kelvin. The prerequisite for achieving the goal according to this invention was therefore the discovery that the Curie temperatures in ferromagnetic semiconductors can be increased up to temperatures of above 160 K and that above 250 Kelvin a high spinpolarization is created by bringing this semiconducting ferromagnetic material into interaction with other charge carriers.

The ferromagnetic second semiconducting layer may be formed by a compound formed from a rare earth element and a respective crystal-forming substance. The rare earths, e.g., Eu and Gd, are particularly well suited because they include elements having a half-filled f shell which therefore have, at low temperatures, a completely spin-polarized ground state. The chalcogens, e.g., O, S or Se (elements of group VI of the periodic system of elements) are examples of suitable respective crystal-forming substances.

The respective crystal-forming substance and, if necessary, the stoichiometry are selected in a way that the element of the rare earths responsible for the spin-polarized state has exactly the valence that results in a magnetic ground state having the highest possible spin polarization. In the case of Eu, this is a positive charge of 2. Thus, chalcogens, e.g., O and S, are suitable as crystal-forming elements. In the case of Gd, a positive charge of 3 is the goal. Accordingly, a suitable crystal-forming substance would include, e.g., N. When using chalcogens with Gd, a stoichiometry of $Gd_2X_3$ (X=chalcogen) will be required.

Suitable materials for the second semiconducting layer include, but are not limited to, EuS, EuO, EuSe, SmS, $Gd_2Se_3$, $Gd_2S_3$ or YbS. These semiconducting compounds are characterized by a spin-polarized ferromagnetic state at low temperatures. To maintain a spin-polarized state at even higher temperatures, preferably above 250 Kelvin or even above 300 Kelvin, a metallic layer may be placed adjacent to the second semiconducting layer. This metallic layer can be formed in particular by a ferromagnetic transition metal, e.g., Co, Fe, Ni or an alloy of such elements.

If the second semiconducting layer is formed by a ferromagnetic semiconductor based on a rare earth element, e.g., EuS, then the d-electrons of a transition metal adjacent to it will generate a charge carrier population in the essentially empty d-band of the second semiconducting layer. This increases the magnetic coupling and thus creates a spinpolarization in the ferromagnetic semiconductor.

Thus, the ground state of the 4f-electrons responsible for the magnetism in EuS is a pure spin state with a half-full 4f-shell, and the d-type conduction band is strongly spin polarized below the Curie temperature with an exchange splitting of 0.18 eV. The energy of this splitting is thus far above the thermal energy of approximately 30 meV at 300 Kelvin and is thus also relevant at room temperature. As a result, electrons in the d-type conduction band are completely spin-polarized, thus permitting an increase in the spinpolarization of EuS through interaction with the d-electrons of a ferromagnetic transition metal.

Accordingly, a ferromagnetic semiconductor having a resistance similar to that of GaAs or Si and also having a spin-polarized (ferromagnetic) state at low temperatures can be created by combining a rare earth element with the respective crystal-forming substance. By interaction with a transition metal layer, the spinpolarization of such a ferromagnetic semiconductor can be influenced to such a degree, that the spinpolarization is even present at room temperature, i.e., at temperatures of 300 Kelvin and even at higher temperatures. The ferromagnetic semiconductor is therefore suitable for producing a spin-polarized state in, e.g., GaAs or Si. For this purpose, the GaAs or Si semiconductor is coupled to the ferromagnetic semiconductor described above, e.g., by designing the two semiconductors as adjacent layers.

In a preferred embodiment of this invention and to achieve particularly high spin polarization in the ferromagnetic semiconducting layer, this semiconducting layer and the metal layer are components of a layer structure in which layers of the semiconducting ferromagnetic layer type and layers of the transition metal layer type are arranged alternately one above the other. A periodic layer structure is particularly suitable.

In a preferred embodiment, the thickness of the semiconducting layers of the ferromagnetic type is at least great enough to produce a spinpolarization, but is not greater than the exchange length of the spin-polarized electrons with the adjacent metal layer.

In one, but not all, embodiments of the present invention, the thickness of the (transition) metal layers is at least great enough so that the Curie temperature is greater than 250 K in the case of a ferromagnetic layer (i.e., at least two atomic layers in the case of Co) and that, in the case of a nonmagnetic layer, a closed layer is formed.

As an alternative to coupling the ferromagnetic semiconducting layer with a metallic layer, the Curie temperature of the ferromagnetic semiconducting layer may also be raised by suitably doping an adjacent first semiconducting layer (GaAs or Si layer).

In a preferred embodiment, the second ferromagnetic semiconducting layer is directly adjacent to the first semiconducting layer (formed by GaAs and/or Si). In another preferred embodiment, an intermediate layer may be provided between these two semiconducting layers.

In an even more preferred embodiment of this invention, the second ferromagnetic semiconducting layer is formed by EuS, and the metal layer used to raise the spinpolarization is formed by Co. In such an embodiment, these two layers are joined by antiferromagnetic coupling, which can result, at temperatures above 250 Kelvin, in high spinpolarization.

According to another aspect of this invention, a semiconducting layer of a ferromagnetic material which, as discussed above, interacts with charge carriers made available outside of the semiconducting layer, such that, above 250 Kelvin, a high spin polarization is created, is used as the source for spin-polarized electrons and/or as a spin filter for electron detection, which can, e.g., be used in electron microscopy.

BRIEF DESCRIPTION OF THE FIGURES

Additional features and advantages of this invention are illustrated in the following description of an exemplary embodiment on the basis of the figures.

They show.

VARIOUS AND PREFERRED EMBODIMENTS

Figure 1:
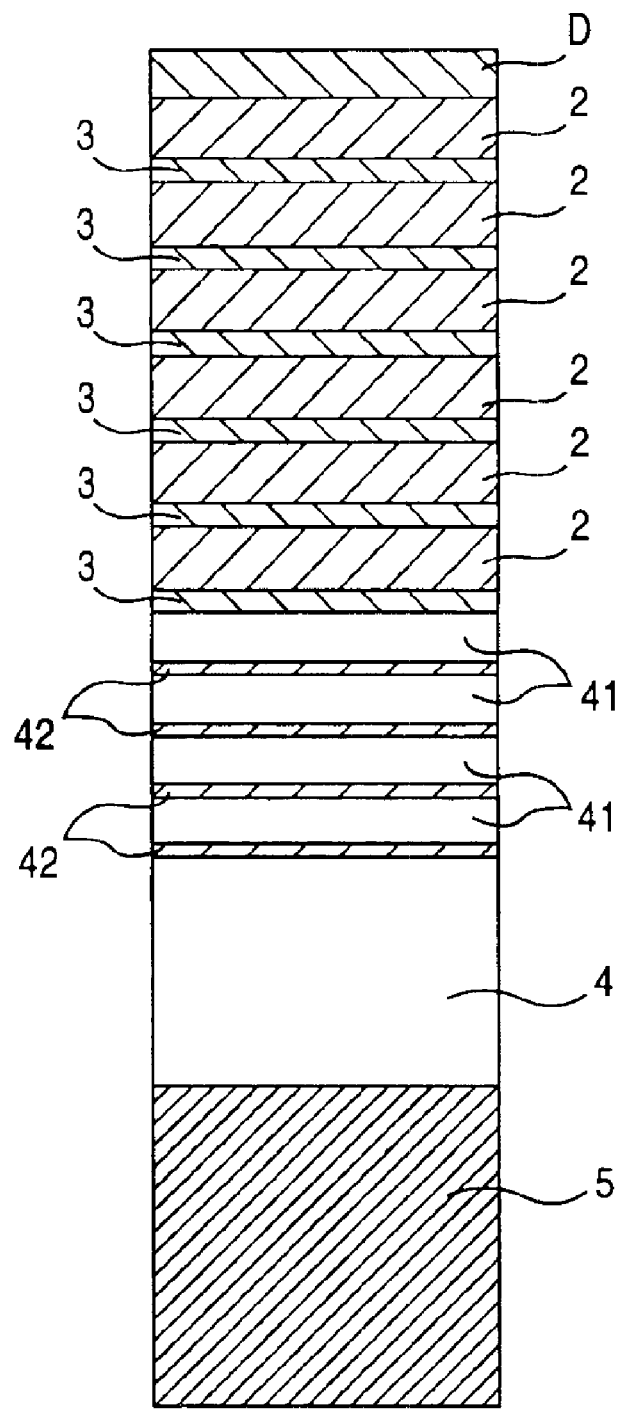
FIG. 1 a layer structure to create a high spinpolarization in a ferromagnetic semiconductor at temperatures of more than 300 Kelvin.
Figure 5:
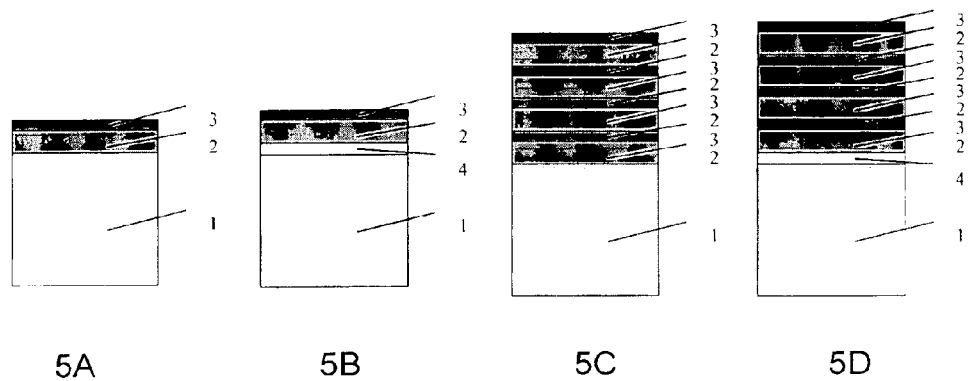
FIG. 5A,B a layer structure to create a high spinpolarization in a ferromagnetic semiconductor at temperatures of more than 300 Kelvin with one alternating second semiconducting layer and metallic layer, with (B) or without (A) an optional buffer layer.
FIG. 5C,D a layer structure to create a high spinpolarization in a ferromagnetic semiconductor at temperatures of more than 300 Kelvin with four alternating second semiconducting layer and metallic layer, with (D) or without (C) an optional buffer layer.

FIG. 1 shows a layer structure comprising six Co/EuS multilayers, i.e., six semiconducting EuS layers 2, each arranged on a Co layer 3, whereby six of such Co/EuS layers 2,3 are being arranged one above the other. FIGS. 5(A–D) show a similar arrangement comprising either one or four Co/EuS multilayers. The substrate for these Co/EuS multilayers in FIG. 1 are Co/Pt multilayers 41, 42, each with a Pt layer 41 on top of a Co layer 42. These are sealed at the bottom by a thicker Pt layer 4, which is arranged on an Si(111) wafer 5 that has been purified by a wet chemical method. The layer structure shown in FIG. 1 is sealed at the top by a Co cover layer D. Similarly, the substrate for these Co/EuS multilayers is an optional buffer layer 4 as in FIGS. 5(B,D), which is arranged on a Si(111) wafer 1 as in FIG. 1.

The EuS layers 2 are layers of a semiconducting material that is ferromagnetic at low temperatures and useful for producing a spin-polarized state in a semiconductor which is to be used as a semiconductor component, e.g., GaAs and/or Si, and which is applied instead of cover layer D to the top EuS layer 2 of the layer structure. The Co layers 3 of the Co/EuS multilayers serve to create such a high spinpolarization in the EuS layers 2 that the spinpolarization in these layers persists even at temperatures of 300 Kelvin or more (the minimum number of Co/EuS double layers is one). At such a high spin polarization, the EuS layers 2 may be used to generate a spin-polarized state in GaAs or Si at room temperature and without cooling it.

The purpose of the optional Co/Pt multiple layers 41, 42 as in FIG. 1 or the buffer layer 4 in FIGS. 5(B,D) is to induce a perpendicular magnetic anisotropy (i.e., perpendicular to the surface of the layer arrangement) in the Co and EuS layers 2,3 above them, to facilitate detection of a spinpolorization in the EuS layers by means of the polar Kerr effect. These Co/Pt multilayers 41, 42 in FIG. 1 or the buffer layer 4 in FIGS. 5(B,D) are not required when the Co/EuS multilayers 2, 3 are used to produce a spin-polarized state in GaAs or Si.

For the Co/Pt multilayers which are arranged on a thicker Pt layer 4, the Si(111) wafer, which has been purified by a wet chemical method and heated (flashed) to temperatures above 1000° C. serves as a substrate. The purification process largely frees the Si(111) wafer of metallic and organic impurities.

Some details of the production of an arrangement according to FIG. 1 are given below.

The substrate base area amounts to approx. 12×12 mm². The substrate is fed into a UHV electron beam vaporization system, where it is heated (flashed) briefly to a minimum of 1000° C. at a basic pressure of approx. $1@10^{-9}$ mbar (a precise temperature measurement at the position of the sample is impossible). Due to the heating process, a 7×7 surface reconstruction occurs on the silicon surface and is detected by the reflection high-energy electron-diffraction method (RHEED).

After cooling of the sample below 50° C., a 50 Å-thick Pt buffer layer is vapor deposited thereon at a starting pressure of less than $3@10^{-9}$ mbar and an electron acceleration voltage of 10 kV. The growth rate is approx. 0.3 Ås$^{-1}$; the pressure is, immediately after the growth process, less than $9@10^{-8}$ mbar.

The starting pressure before vapor deposition of all the other layers is always less than $3@10^{-9}$ mbar; the temperature is below 40° C. and the electron acceleration voltage for vapor deposition of platinum and cobalt is 10 kV and for EuS is 7 kV. To produce a magnetic substrate for the EuS/Co layer systems, four Co/Pt double layers are applied. The growth rate of the 3 Å-thick Co layers is approx. 0.07 Ås$^{-1}$ and that of the 11 Å-thick Pt layers is approx. 0.3 Ås$^{-1}$. The pressure shortly after vapor deposition of the layers is always lower than $2@10^{-8}$ mbar.

To investigate the magneto-optical properties of the Co/Pt multilayers, the samples are removed from the electron beam vaporization chamber and, in the atmosphere, half covered with a sheet of tantalum. The samples are then again introduced into the chamber for vapor deposition of the EuS/Co layers, whereupon a first sample A is produced with 5 Å-thick Co layers and 27.7 Å-thick EuS layers, and a second sample B is produced with 5 Å-thick Co layers and 13.8 Å-thick EuS layers. The growth rate of the 5 Å-thick Co layers is approx. 0.1 Ås$^{-1}$, that of the 27.7 Å-thick EuS layers is approx. 0.3 Ås$^{-1}$ (sample A) and that of the 13.8 Å-thick EuS layers is approx. 0.25 Ås$^{-1}$ (sample A). Finally, a 10 Å-thick Co layer is applied to both samples at a growth rate of approx. 0.14 Ås$^{-1}$ (sample A) and 0.2 Ås$^{-1}$ (sample B).

The exact structure of the layers having dimentions according to sample B is shown in FIG. 1 and has already been described above in greater detail. In the semiconductor array of the invention the thickness of the semiconducting layer 2 is about 2 Å to about 1000Å. Perferably, the thickness of this second semiconducting layer is in the range of about 5 Å to about 200Å. In addition, the thickness of the metallic layer in the semiconductor array of the invention is in the range of about 2 Å to about 1000 Å.

In such layer structures, a high spinpolarization can be detected in the EuS layers at 300 Kelvin, on the basis of the polar magneto-optical Kerr effect and, in particular, on the basis of an element specific x-ray circular dichroism.

In the measurement of the x-ray circular dichroism, electrons are displaced from the inner electron layer. The resulting holes are filled with electrons from higher electron layers. The energy produced during this process is released either in the form of x radiation or, via the Auger-effect, as secondary electrons. In the chosen set up, the total yield of the electron current was measured, that is, all electrons, which due to their interaction with the x radiation, could leave the solid object, were measured. By choosing the energy of x radiation, certain electron transitions for specific elements can be selected. A spinpolarization in an element results in different absorption for left and right circularly polarized x radiation at the for the element characteristic X ray energy and thus, in differing total yield. By plotting the norm difference of the total yield of left and right polarized x radiation, an element specific signal is obtained which is proportional of the magnetism of the element.

The polar magneto-optical Kerr effect measures a signal which is proportional to the component of magnetization perpendicular to the plane of the layer. Detection of the ferromagnetic order with the help of the polar Kerr effect is based on the following two assumptions:

1. The magnetic behavior of EuS and Co can be differentiated through a suitable choice of light energy as a result of the different spectral dependence of the Co spectrum and the EuS Kerr spectrum. With its localized 4f-electrons, EuS has a characteristic line form resembling a horizontal "S" whereas Co is characterized by only a weak spectral dependence of the Kerr spectrum. In particular, Co makes contributions to the Kerr effect in the near infrared range (i.e., below 1 eV) where EuS does not have any magneto-optical activity, because this energy is lower than the band gap of the semiconductor. Thus, the magnetic properties of the Co layers can essentially be measured below 1 eV. However, where the local 4f-electrons of EuS make their contribution to the magneto-optical signal (at approx. 2 eV and, because of the crystal field splitting of the d-conduction band, also at approx. 4 eV), the magnetic properties of the EuS layers are primarily measured.

2. Without an external magnetic field, the two magnetic subsystems Co and EuS are antiferromagnetically coupled. Then when a strong magnetic field is applied, the antiferromagnetic coupling can be eliminated. As a result of this, the subsystem, originally having an antiparallel orientation, now increasingly develops a parallel orientation to the (magnetically) dominant subsystem. In a preferred embodiment, when the magnetic subsystems are antiferromagnetically coupled, each of the two subsystems has its own ferromagnetic order.

Figure 2:
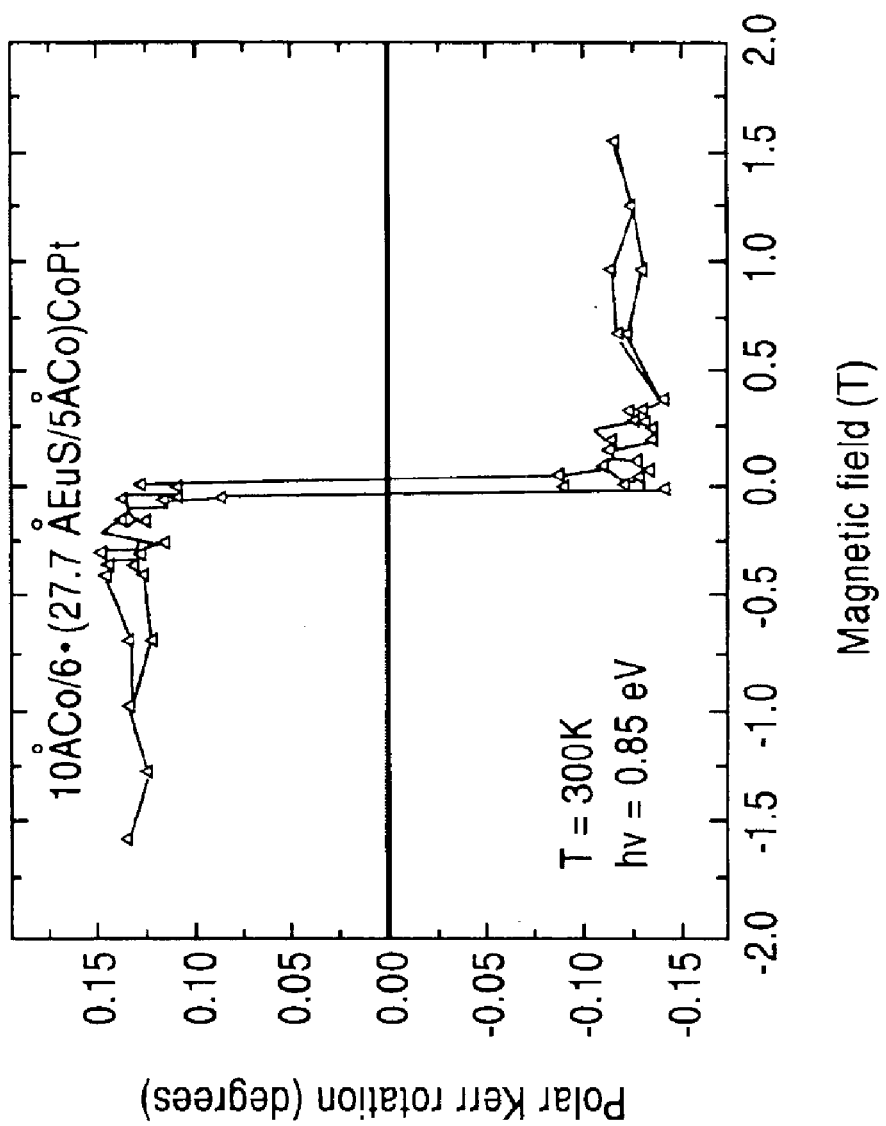
FIG. 2 a magneto-optical hysteresis curve of a layer structure according to FIG. 1 at 0.85 eV.
Figure 3:
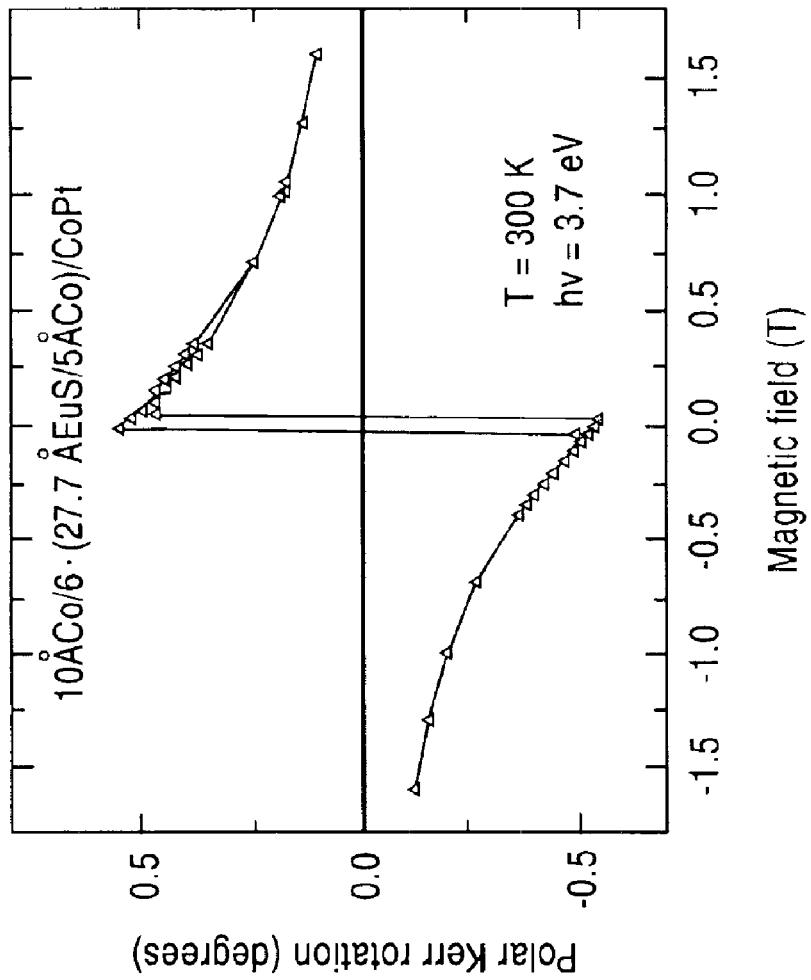
FIG. 3 a magneto-optical hysteresis curve of a layer structure according to FIG. 1 at 3.7 eV.

By measuring the Kerr rotation as a function of the applied magnetic field at a first light energy at which first the Co subsystem is magneto-optically dominant and then at a second light energy at which the EuS subsystem is magneto-optically dominant, characteristic differences should become apparent in the curves. The corresponding magneto-optical curves shown in FIGS. 2 and 3 for sample A were analyzed as a function of the external magnetic field at 0.85 eV (Co component of the magneto-optical signal, FIG. 2) and at 3.7 eV (EuS component of the magneto-optical signal, FIG. 3). The ferromagnetic order in the Co layers is clearly recognizable. In the EuS layers, the nonlinear course of the hysteresis curve is clearly visible. At high magnetic fields, the antiferromagnetic coupling to the Co layers is broken and the magnetic moments of EuS are then aligned parallel to those of Co. It follows, however, that the EuS layers at 300 K have a spinpolarization, which are antiferromagnetically ordered to the magnetic moment of Co.

With the EuS layers 2 coupled to Co layers 3 in the manner described above, a spinpolarized semiconducting material is produced, which has three important advantages for applications in spin electronics (spintronics):

The material is semiconducting and is thus adapted with regard to its electric resistance to the GaAs and Si semiconductors, which are conventional in the semiconductor industry.

The material has a high spin polarization at room temperature and thus makes it possible to produce a high spin polarization in GaAs and Si without requiring cooling.

The molecular ground state of the material is completely spin polarized. This guarantees an optimum spin filter effect, i.e., optimum spin injection into an adjacent GaAs or Si semiconductor.

In a preferred embodiment, though not in all embodiments, the EuS layers have all three of these advantages.

The EuS layer thus forms an optimum spin injection layer for spin electronics.

The deciding factor here is that a high spin polarization in the semiconductor EuS can be created above room temperature by stacking EuS and Co layers. This property has been verified by means of the magneto-optical Kerr effects and the x-ray circular dichroism described above.

Figure 4A:
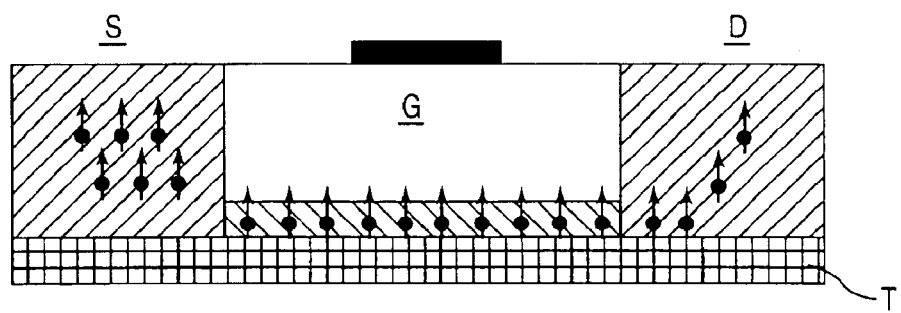
FIG. 4a use of a layer structure with high spin polarization in a ferromagnetic semiconductor in a spin transistor.

FIG. 4a shows an application of a Co/EuS layer structure for spin injection in a GaAs semiconductor in the case of a spin transistor in the form of a field effect transistor. The field effect transistor shown in FIG. 4a is situated on a semiconducting substrate T and includes a source region S, a gate region G and a drain region D.

The gate region G is formed in a known manner by a semiconducting heterostructure, in particular using a II-VI or III-V-semiconductor, e.g., GaAs. The source region S and the drain region D are each formed by a layer structure having at least one layer of a ferromagnetic semiconductor, e.g., EuS, and a metallic layer of a transition metal, e.g., Co, adjacent thereto. This metallic layer may act as a charge carrier source. Coupling of the layer of a ferromagnetic semiconducting material to a metallic layer serves to produce a high spin polarization in the ferromagnetic semiconducting material at room temperature, as described previously with reference to FIG. 1. The layer structure forming the source region and the drain region has at least one metallic layer and at least one layer of a ferromagnetic semiconducting material. However, a plurality of such layers may also be provided.

Because of the use of a ferromagnetic semiconducting material to form the source region S of the spin transistor shown in FIG. 4a, a spin-polarized (2D) electron current is injected into the gate region G, comprising GaAs or some other conventional semiconductor, whereby the electrons go with an unchanged spin from the source region S to the drain region D. FIG. 4a shows schematically in the form of arrows the spin of individual electrons, each arrow denoting the orientation of the spin.

Figure 4B:
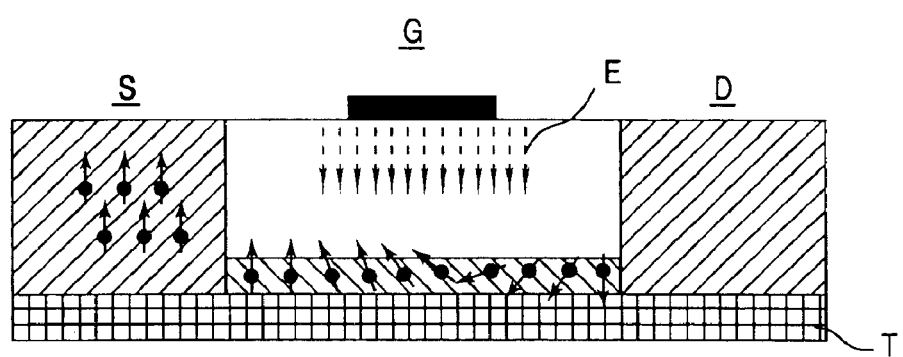
FIG. 4b the spin transistor from FIG. 4a with a voltage applied.

FIG. 4b shows the spin transistor from FIG. 4a after applying an electric voltage, so that an electric field E acts on the gate region G; therefore, the spin of the electrons in the gate region G is rotated. Due to this change in polarization, electrons are rejected at the interface between the gate region G and drain region D.

What is claimed is:

1. A semiconductor array comprising
a first semiconductor layer,
a second semiconductor layer comprising at least one ferromagnetic material coupled to said first semiconducting layer,
a charge carrier source adjacent to and outside said second semiconducting layer which charge carrier source is coupled to said second semiconducting layer,
wherein said charge carrier source is adapted to provide said second semiconducting layer with charge carriers, wherein said second semiconducting layer has the property of having a spin polarization at a temperature of at least 250 Kelvin, and wherein said second semiconducting layer is adapted to inject a spin-polarized state of at least one semiconducting charge carrier into the first semiconducting layer.

2. The semiconductor array of claim 1, wherein the first semiconducting layer comprises a material that is not spin-polarized in the ground state.

3. The semiconductor array of claim 1, wherein the first semiconducting layer comprises a semiconducting material based on GaAs or Si.

4. The semiconductor array of claim 1, wherein the second semiconducting layer comprises a rare earth element and a respective crystal-forming substance.

5. The semiconductor array of claim 4, wherein the crystal-forming substance is an element of main group V or VI of the periodic system.

6. The semiconductor array of claim 1, wherein the second semiconducting layer comprises an element having a completely spin-polarized ground state and a respective crystal-forming substance.

7. The semiconductor array of claim 1, wherein the second semiconducting layer comprises a rare earth element having a half-filled f-shell and a respective crystal-forming substance.

8. The semiconductor array of claim 7, wherein said rare earth element is Eu of Gd.

9. The semiconductor array of claim 7, wherein said crystal-forming substance is O, S, Se, Te, N, P, As or Sb.

10. The semiconductor array of claim 1, wherin the second semiconducting layer comprises EuS, EuO, EuSe, GdN, SmS, $Gd_3S_3$, $Gd_2Se_3$, $Gd_xS_y$, $Gd_xSe_y$ or combinations thereof,
wherein x and y are integers from 1–5.

11. The semiconductor array of claim 1, wherein said at least one charge carrier interacting with the second semiconducting layer is made available by a metallic layer adjacent to the second semiconducting layer.

12. The semiconductor array of claim 11, wherein the metallic layer comprises a transition metal.

13. The semiconductor array of claim 12, wherein said transition metal is Co, Fe, Ni or alloys thereof.

14. The semiconductor array of claim 11, wherein the second semiconducting layer and the metallic layer form a layer structure with alternating second semiconducting layer(s) and metallic layer(s).

15. The semiconductor array of claim 14, wherein the layer structure is a periodic layer structure.

16. The semiconductor array of claim 11, wherein the thickness of the metallic layer is about 2 Å to about 1000 Å.

17. The semiconductor array of claim 11, wherein the second semiconducting layer comprises EuS and the metallic layer comprises Co.

18. The semiconductor array of claim 17, wherein the second semiconducting layer consists essentially of EuS and the metallic layer consists essentially of Co.

19. The semiconductor array of claim 11, wherein the metallic layer has a thickness that is ferromagnetic at room temperature.

20. The semiconductor array of claim 1, wherein the thickness of the second semiconducting layer is about 2 Å to about 1000 Å.

21. The semiconductor array of claim 20, wherein said thickness is about 5 Å to about 200 Å.

22. The semiconductor array of claim 1, wherein the second semiconducting layer is directly adjacent to the first semiconducting layer.

23. The semiconductor array of claim 1, wherein the second semiconducting layer is joined to the first semiconducting layer via an intermediate layer.

24. The semiconductor array of claim 1, wherein the thickness of the second semiconducting layer is at least great enough to produce a spinpolarization, but is not greater than the exchange length of the spin-polarized electrons with the adjacent metal layer.

25. A method of using a semiconducting layer of a ferromagnetic material as the source for spin-polarized electrons and/or for electron detection comprising providing a first semiconducting layer, providing a second semiconducting layer comprising a ferromagnetic material;

coupling said second semiconducting layer to a first semiconducting layer, providing the second semiconducting layer with charge carriers by coupling a charge carrier source adjacent to and outside the second semiconducting layer, so that, when in use, in the second semiconducting layer a spin polarization is produced at at least 250 Kelvin.

26. A method of claim 25, wherein the spin-polarized state of at least one semiconducting charge carrier of said second semiconducting layer is injected into the first semiconducting layer.

27. A semiconductor array comprising a first semiconducting layer, and a second semiconducting layer made of ferromagnetic material which is coupled to said first semiconducting layer, in such a way that, when in use, a spin-polarized state of at least one semiconducting charge carrier of said second semiconducting layer is injected into the first semiconducting layer, and whereby the second semiconducting layer interacts with charge carriers made available from an charge carrier source adjacent to and outside the second semiconducting layer in such a way that a high spin polarization is produced at 250 Kelvin in the second semiconductor layer.

* * * * *